(12) United States Patent
Voss et al.

(10) Patent No.: US 11,721,771 B2
(45) Date of Patent: Aug. 8, 2023

(54) LIQUID SEMICONDUCTOR-HALOGEN BASED ELECTRONICS

(71) Applicant: Lawrence Livermore National Security, LLC, Livermore, CA (US)

(72) Inventors: Lars Voss, Livermore, CA (US); Clint Frye, Livermore, CA (US); Roger A. Henderson, Brentwood, CA (US); John Winter Murphy, Mountain House, CA (US); Rebecca J. Nikolic, Oakland, CA (US); Dongxia Qu, Livermore, CA (US); Qinghui Shao, Fremont, CA (US); Mark A. Stoyer, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 1233 days.

(21) Appl. No.: 15/812,682

(22) Filed: Nov. 14, 2017

(65) Prior Publication Data

US 2018/0145187 A1 May 24, 2018

Related U.S. Application Data

(60) Provisional application No. 62/421,959, filed on Nov. 14, 2016.

(51) Int. Cl.
*H01L 29/872* (2006.01)
*H01L 23/31* (2006.01)
(Continued)

(52) U.S. Cl.
CPC ............ *H01L 29/872* (2013.01); *G21H 1/06* (2013.01); *H01L 23/3107* (2013.01);
(Continued)

(58) Field of Classification Search
CPC ... H01L 29/872; H01L 29/861; H01L 29/267; H01L 31/02725; H01L 31/03044;
(Continued)

(56) References Cited

U.S. PATENT DOCUMENTS

2006/0251204 A1 11/2006 Tsang et al.
2007/0080605 A1* 4/2007 Chandrashekhar ...... G21H 1/02
310/303
(Continued)

OTHER PUBLICATIONS

Hosokawa, Electronic Properties of Liquid Selenium Containing Alkali and Halogen Impurities, Journal of the Physical Society of Japan, vol. 54, No. 12, Dec. 1985, pp. 4717-4725 (Year: 1985).*
(Continued)

*Primary Examiner* — Devina Pillay
(74) *Attorney, Agent, or Firm* — Zilka-Kotab, P.C.

(57) ABSTRACT

According to one embodiment, a device includes a first electrode, a second electrode spaced from the first electrode, a well extending between the first electrode and the second electrode, one or more chalcogens in the well, and at least one halogen mixed with the one or more chalcogens in the well. In addition, the chalcogens are selected from the group consisting of sulfur, selenium, tellurium, and polonium.

20 Claims, 10 Drawing Sheets

(51) Int. Cl.

| | |
|---|---|
| *H01L 29/24* | (2006.01) |
| *H01L 29/18* | (2006.01) |
| *H01L 29/861* | (2006.01) |
| *H01L 29/267* | (2006.01) |
| *H01L 31/0272* | (2006.01) |
| *H01L 31/0304* | (2006.01) |
| *H01L 31/072* | (2012.01) |
| *G21H 1/06* | (2006.01) |

(52) U.S. Cl.
CPC .............. *H01L 29/18* (2013.01); *H01L 29/24* (2013.01); *H01L 29/267* (2013.01); *H01L 29/861* (2013.01); *H01L 31/0272* (2013.01); *H01L 31/02725* (2013.01); *H01L 31/03044* (2013.01); *H01L 31/072* (2013.01)

(58) Field of Classification Search
CPC .............. H01L 31/0272; H01L 31/072; H01L 23/3107; H01L 29/24; H01L 29/18; G21H 1/06; G21H 1/04
See application file for complete search history.

(56) References Cited

U.S. PATENT DOCUMENTS

| | | | |
|---|---|---|---|
| 2010/0233518 A1* | 9/2010 | Kwon | G21H 1/00 429/7 |
| 2016/0211042 A1* | 7/2016 | Burgett | H01L 31/115 |
| 2017/0032862 A1* | 2/2017 | Kwon | G21G 1/04 |

OTHER PUBLICATIONS

Perron, Impurity dependence of the viscosity of liquid selenium, Philosophical Magazine B, 1982, vol. 46, No. 4, 321-330 (Year: 1982).*

Wacharasindhu, Mechanisms Leading to Losses in Conventional Betavoltaics and Evolution: Utilizing Composite Semiconductor With Infused Radioisotope for Efficiency Improvement, Journal of Microelectromechanical Systems, vol. 23, No. 1, Feb. 2014 (Year: 2014).*

Nikolic et al., U.S. Appl. No. 14/214,244, filed Mar. 14, 2014.

Wacharasindhu et al., "Encapsulated Radioisotope for Efficiency Improvement of Nuclear Microbattery," PowerMEMS, 2009, pp. 193-196.

Wacharasindhu et al., "Liquid Semiconductor Diode as a Thermal Harvester for High Temperature Applications," PowerMEMS 2008+ microEMS 2008, Nov. 9-12, 2008, pp. 53-56.

Wikipedia, "Selenium monochloride," Wikipedia, Mar. 2017, pp. 1-2, retireved from https://en.wikipedia.org/wiki/Selenium_monochloride.

Wacharasindhu et al., "Radioisotope microbattery based on liquid semiconductor," Applied Physics Letters, vol. 95, 2009, 4 pages.

Enderby et al., "Liquid Semiconductors," IOPscience, Reports on Progress, vol. 53, 1990, pp. 85-179.

Okamoto, H., "I-Se (Iodine-Selenium)," Binary Alloy Phase Diagrams, 1990 (from ASM Alloy Phase Diagrams Center Research Database), 1 page.

* cited by examiner

LIQUID SEMICONDUCTOR-HALOGEN BASED ELECTRONICS

RELATED APPLICATIONS

The present claims priority to U.S. Provisional Application No. 62/421,959, filed Nov. 14, 2016, which is incorporated herein by reference in its entirety.

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to semiconductor electronics, and more particularly, this invention relates to liquid semiconductor-halogen based electronics, e.g., selenium-halogen based electronics.

BACKGROUND

Typically, semiconductors are solid materials, either as a crystalline lattice or in some instances as an amorphous material. Radioisotope batteries have existed for several decades and are conventionally made of a combination of a solid semiconductor (e.g. GaAs, SiC) with a layer of radioactive material in close proximity. However, solid semiconductor structures are susceptible to damage by the radioactive material. Thus, in order to avoid damage to the solid semiconductor crystal lattice, the radioactive material typically will be a beta emitter of relatively low energy such as tritium. However, if the beta emitter is over a certain energy threshold, the beta emitters will also destroy the semiconductor. Beta batteries have ionizing radiation that can be extremely damaging to the semiconductor. Moreover, an alpha voltaic, with energies typically greater than 3 MeV, tends to be damaging to the solid semiconductor material. Damage to the crystal lattice of the solid semiconductor by the radioisotope emitters in turn degrades the charge transport properties of the device. It would be desirable to make a lasting voltaic device that can accommodate both low and high energy betas as well as alpha particles, which have significantly higher energy than most beta particles, and gamma rays.

Further, some radioisotopes undergo spontaneous fission and release fission fragments with even greater energy. Thus, a battery containing these fission fragments could have a very high energy density compared to its radioactivity. It would be desirable to utilize a semiconductor material that would be impervious to radiation and other forms of damage.

Liquid semiconductors may accommodate high energy radioactive particles. A number of liquid semiconductors are known, including sulfur (S), tellurium (Te), selenium (Se), and many binary chalcogenides such as lead selenide (PbSe), silver selenide ($Ag_2Se$), and zinc telluride (ZnTe). Of these chalcogens such as S, Se, and Te are of interest in that they are elemental and have the lowest melting points. Liquid Se (l-Se) is also orders of magnitude less conductive than other liquid semiconductors, with a conductivity of $\sim 10^{-8}$ $\Omega^{-1} cm^{-1}$, a useful characteristic for many electronic devices as it indicates a low background carrier density and potentially long depletion width. Furthermore, the reasonable band gap (1.8 eV), low hole concentration ($3 \times 10^{13}$ $cm^{-3}$), and low but not unacceptable mobility (2 $cm^2/V\text{-}s)^2$, suggest that l-Se would be useful for semiconductor electronics. Other chalcogens are of interest for similar reasons as well, although their properties are not fully established. However, the high melting point of l-Se, greater than 200° C., is a considerable drawback that adds significant complexity to fabrication, packaging, and use. Developing a liquid semiconductor material capable of operating at reduced temperature has been elusive.

There is a need to develop resilient semiconductor/radioactive material electronics that would be useful as radiation detectors, sensors and other electronics for harsh environment (e.g. space, within or in proximity to a nuclear reactor or other radiation source, as a thermoelectric to generate power in harsh environments, etc).

SUMMARY

In one embodiment, a device includes a first electrode, a second electrode spaced from the first electrode, a well extending between the first electrode and the second electrode, one or more chalcogens in the well, and at least one halogen mixed with the one or more chalcogens in the well. In addition, the chalcogens are selected from the group consisting of sulfur, selenium, tellurium, and polonium.

In another embodiment, a device includes a first electrode, a second electrode spaced from the first electrode, a well extending between the first electrode and the second electrode, and a mixture in the well. The mixture in the well includes a liquid semiconductor material and at least one halogen.

In yet another embodiment, a heterojunction device includes a first electrode where the first electrode includes a metal, a second electrode spaced from the first electrode, where the second electrode includes a first semiconductor material, a well extending between the first electrode and the second electrode, and a mixture in the well. The mixture in the well includes a liquid semiconductor material and at least one halogen where the liquid semiconductor material is a second semiconductor material, and where the first semiconductor material is different from the second semiconductor material.

Other aspects and advantages of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of liquid semiconductor-halogen based electronics and/or related systems and methods.

In one general embodiment, a device includes a first electrode, a second electrode spaced from the first electrode, a well extending between the first electrode and the second electrode, one or more chalcogens in the well, and at least one halogen mixed with the one or more chalcogens in the well. In addition, the chalcogens are selected from the group consisting of sulfur, selenium, tellurium, and polonium.

In another general embodiment, a device includes a first electrode, a second electrode spaced from the first electrode, a well extending between the first electrode and the second electrode, and a mixture in the well. The mixture in the well includes a liquid semiconductor material and at least one halogen.

In yet another general embodiment, a heterojunction device includes a first electrode where the first electrode includes a metal, a second electrode spaced from the first electrode, where the second electrode includes a first semiconductor material, a well extending between the first electrode and the second electrode, and a mixture in the well. The mixture in the well includes a liquid semiconductor material and at least one halogen where the liquid semiconductor material is a second semiconductor material, and where the first semiconductor material is different from the second semiconductor material.

A list of acronyms used in the description is provided below.

3D Three dimensional
Ar Argon
AZO Aluminum-doped zinc oxide
$Br_2$ Bromine
C Celsius
$Cl_2$ Chlorine
EtOH Ethanol
$F_2$ Fluorine
eV Electron volt
FF Fill factor
FTO Fluorine-doped tin oxide
GaAs Galium arsenide
GaN Gallium nitride
$I_2$ Iodine
$I_{sc}$ Short-circuit current
ITO Indium tin oxide
Jsc Short-circuit current density
meV milli electron volts
MeV mega electron volts
μm micron
Po Polonium
S Sulfur
Se Selenium
SiC Silicon carbide
SU-8 SU-8 negative photoresist
TaC Tantalum carbide
TaN Tantalum nitride
Te Tellurium
TEM Transmission Electron Microscopy
$TiB_2$ Titanium diboride
UV Ultraviolet
V Volt
$V_{oc}$ Open circuit voltage The following description discloses several preferred embodiments of a semiconductor device comprised of a liquid semiconductor, such as Se, in combination with solid state materials in order to define a closed system that can support electrical conduction. Various embodiments show that mixtures of liquid semiconductor, e.g. liquid selenium, at equilibrium with halogen, e.g. iodine, can reduce the melting point of the liquid semiconductor mixture between −50° C. to 220° C., depending on the selenium:halogen ratio. Furthermore, various embodiments described herein demonstrate semiconducting properties of devices that include a mixture of liquid semiconductor and halogen.

Embodiments described herein include a device that is similar to a photovoltaic cell, but instead of light as the input power source the device uses a radioisotope. The radioisotope-voltaic device described herein emits beta (β) radiation or alpha (α) radiation, and, possibly, gamma (γ) radiation or fission fragments, and includes a liquid semiconductor instead of a solid semiconductor. Without any solid structure (e.g. crystal lattice) liquid semiconductors, preferably an elemental semiconductor, are less susceptible to radioisotope damage.

Figures 1A, 1B:
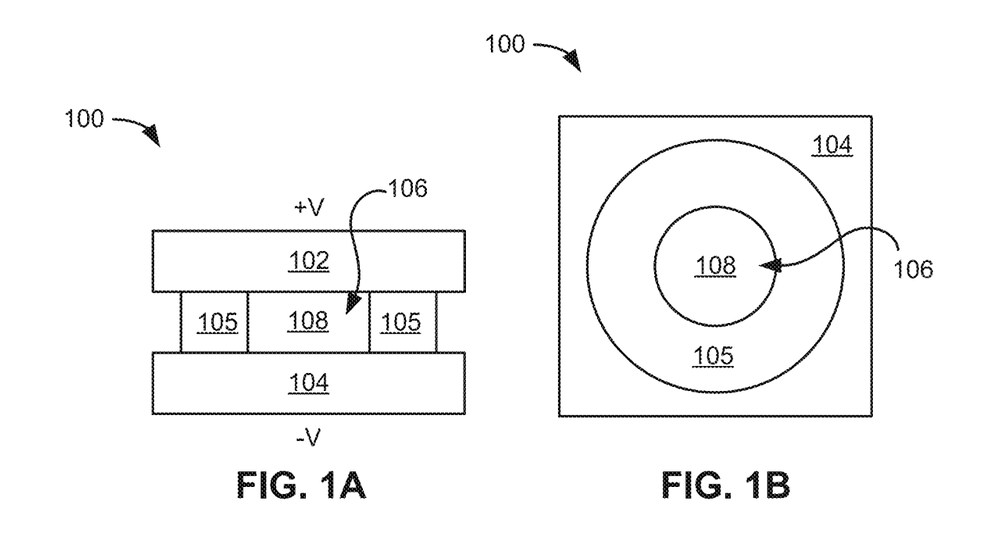
FIG. 1A is a schematic drawing of a cross-section view of a device according to various embodiments.
FIG. 1B is a schematic drawing of a top down view of a device according to various embodiments.
Figure 1C:
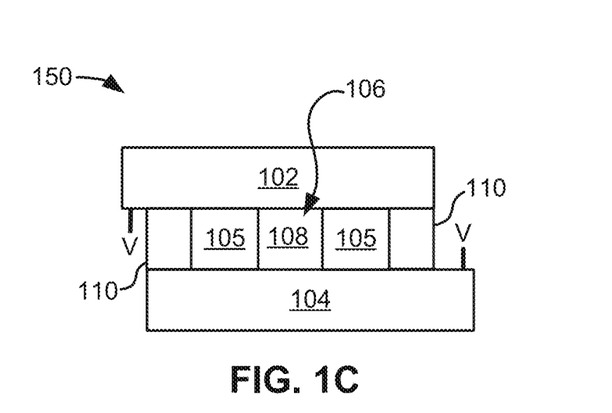
FIG. 1C is a schematic drawing of a cross-section view of a device according to various embodiments.

FIGS. 1A-1C depicts device 100 and 150, in accordance with one embodiment. As an option, the present devices 100, 150 may be implemented in conjunction with features from any other embodiment listed herein, such as those described with reference to the other FIGS. Of course, however, such devices 100, 150 and others presented herein may be used in various applications and/or in permutations which may or may not be specifically described in the illustrative embodiments listed herein. Further, devices 100, 150 presented herein may be used in any desired environment.

According to one embodiment, a device includes a first electrode, a second electrode spaced from the first electrode, a well extending between the first electrode and the second electrode, and a liquid semiconductor material in the well. A liquid semiconductor material as defined herein is a material that acts as a semiconductor in the liquid state.

FIG. 1A shows a cross-section of the device 100. According to one embodiment, the device may include a first electrode 102, a second electrode 104 spaced from the first electrode 102, a wall 105 defining a well 106 extending between the first electrode 102 and the second electrode 104, and a mixture 108 in the well 106. In some approaches, the mixture 108 in the well 106 may include one or more chalcogens in the well and at least one halogen.

In one approach, the mixture 108 in the well 106 may include sulfur. In another approach, the mixture 108 in the well 106 may include selenium. In yet another approach, the mixture 108 in the well 106 may include tellurium. In yet another approach, the mixture 108 in the well 106 may include polonium.

In some approaches, the mixture 108 in the well 106 may include a liquid semiconductor material, for example, but not limited to, liquid selenium (l-Se). A liquid semiconductor material as defined herein as a material that acts as a semiconductor in the liquid state.

In some approaches, the first electrode may be an upper contact, a substrate, or a combination thereof, etc. In other approaches, the electrode may be a layer on a substrate. For example, but not intending to be limiting in any way, the first electrode may include a glass slide as a substrate coated with a first electrode. Likewise, in some approaches, the second electrode may be a lower contact, a substrate, or a combination thereof. For example, but not intended to be limiting in any way, the second electrode may be a glass slide as a substrate coated with a second electrode.

In some embodiments, the mixture 108 in the well 106 may include a liquid semiconductor material and at least one halogen. In some approaches, the liquid semiconductor material may include one or more chalcogens. In some approaches, the mixture 108 in the well 106 may include l-Se:halogen. In some approaches, the halogen included with the liquid semiconductor in the well may be chlorine. In other approaches, the halogen included with the liquid semiconductor in the well may be bromine. In yet other approaches, the halogen included with the liquid semiconductor in the well may be iodine. In yet other approaches, the halogen included with the liquid semiconductor in the well may be fluorine.

FIG. 1B shows a top view of the device 100 in which the mixture 108 of liquid semiconductor material is positioned inside the well 106 and the well 106 is positioned on top of the second electrode 104 (note in this top view, the first electrode 102 is not shown).

According to various embodiments, the device may be encapsulated to prevent contamination from unwanted environmental products and to prevent loss of the liquid semiconductor/halogen to the environment. The halogens used in the device are volatile at room temperature and thus encapsulation of the device is preferable to prevent loss of halogens from the device over time. Further, it is important to prevent unwanted environmental interaction with the liquid semiconductor, such as with oxygen.

Highly impermeable and inert encapsulating layers may be used for encapsulation. In some embodiments, the walls 105 defining the well 106 may include encapsulant material. In some approaches the well 106 may include encapsulant material. In some approaches, the device may have an impermeable encapsulant encapsulating at least a portion of the liquid semiconductor material. In other approaches, the encapsulant may surround the outside of the walls of the well. In some approaches, the liquid semiconductor may be encapsulated using impermeable, inert material such as fluorocarbons, polymers, $SiO_2$, etc. to prevent oxidation or other unwanted reactions from affecting the liquid semiconductor and to prevent loss of the liquid semiconductor to the environment. In an exemplary approach, the encapsulant may include an epoxy material. In some approaches, the encapsulant may be formed by a spin on pattern of a polymer. Examples of materials to encapsulate the device may include Teflon, spin on Teflon, silicon dioxide, epoxy, photoresist, SU-8, etc.

FIG. 1C illustrates a cross section a design of a vertical device according to one embodiment. The first electrode 102 may include GaN and the second electrode 104 may include ITO. The well 106 that surrounds the mixture 108 of liquid semiconductor may include an epoxy material, for example the epoxy-based negative photoresist SU-8. The mixture 108 of the liquid semiconductor material may be Selenium-Iodine (Se—I). In addition, as illustrated in FIG. 1C, an epoxy material 110 may encapsulate the well 106 (e.g. Su-8 material) and the mixture 108 of liquid semiconductor material in the well 106.

In some embodiments, the liquid semiconductor material may includes at least one of a pure chalcogen, where a halogen may be present in an effective amount to suppress the melting point of the liquid semiconductor material relative to the at least one of a pure chalcogen. Various embodiments include a liquid semiconductor that may be mixed with halogens such as $F_2$, $Cl_2$, $Br_2$, $I_2$, etc. to depress the melting point of one or more chalcogens in the liquid semiconductor. In some approaches, a liquid semiconductor may be mixed with one or more halogens to suppress the melting point below 100° C. In some approaches, the fabrication of liquid semiconductors may be based on selenium <100° C., preferably at or near room temperature. Liquid selenium is known to be semiconducting and has one of the lowest melting points of any inorganic semiconductor, at 220° C. Mixtures of selenium with halogens such as Cl, Br, and I produce a mix of selenous halide (e.g. $SeCl_4$) in equilibrium with pure selenium, and the melting point of these mixes can be significantly depressed; in the case of I, no halide compound is known to exist and the Se exists in equilibrium with the $I_2$. In the most extreme case, mixtures with Cl could depress the melting point to nearly −50° C. Various embodiments described herein include mixtures of Se:halogen ratios that retain semiconducting characteristics (see below Experiments section).

In some embodiments, the halogen may be present in an effective amount relative to the semiconductor to suppress the melting point of the liquid semiconductor material to below about 100° C. In some approaches, the halogen may be present in an effective amount relative to the semiconductor to suppress the melting point of the liquid semiconductor material to below about 150° C. In other approaches, the halogen may be present in an effective amount relative to the semiconductor to suppress the melting point of the liquid semiconductor material to below about 75° C. In yet other approaches, the halogen may be present in an effective amount relative to the semiconductor to suppress the melting point of the liquid semiconductor material to below about 0° C. In yet other approaches, the halogen may be present in an effective amount relative to the semiconductor to suppress the melting point of the liquid semiconductor material to below about −25° C.

According to some embodiments, as a bias is applied to the first electrode 102 or the second electrode 104 (as shown in FIG. 1A as +V and −V), the device 100 may function as a semiconductor device. For example, in some approaches, the device may function as a p-i-n diode. In other approaches, the device may function as a photovoltaic battery. In yet other approaches, the device may function as a radioisotope battery.

According to various embodiments described herein, the liquid semiconductor may be in contact via an electrode with a solid semiconductor (ceramic or metal), such as GaN, to form a heterojunction. The other contact may comprise an electrode of a conductor forming an ohmic contact or an additional solid semiconductor forming a second heterojunction. According to various embodiments, the materials of the electrodes 102, 104 may include metals such as Al, In, Ni, Au, Pt, etc., conducting ceramics such as ITO, FTO, AZO, TaC, TiB$_2$, TaN, etc. or semiconductors such as SiC, GaN, Si, GaAs, etc. Using dissimilar materials or two differently doped semiconductors for the two electrodes 102, 104 may enable lower background current, better current collection, and higher output voltage. With proper selection of the electrodes, degradation at the contacts due to chemical and electrochemical reactions may be eliminated.

In some embodiments, a material of the first electrode 102 may be different from a material of the second electrode 104, where the device 100 may function as a diode.

Figure 1D:
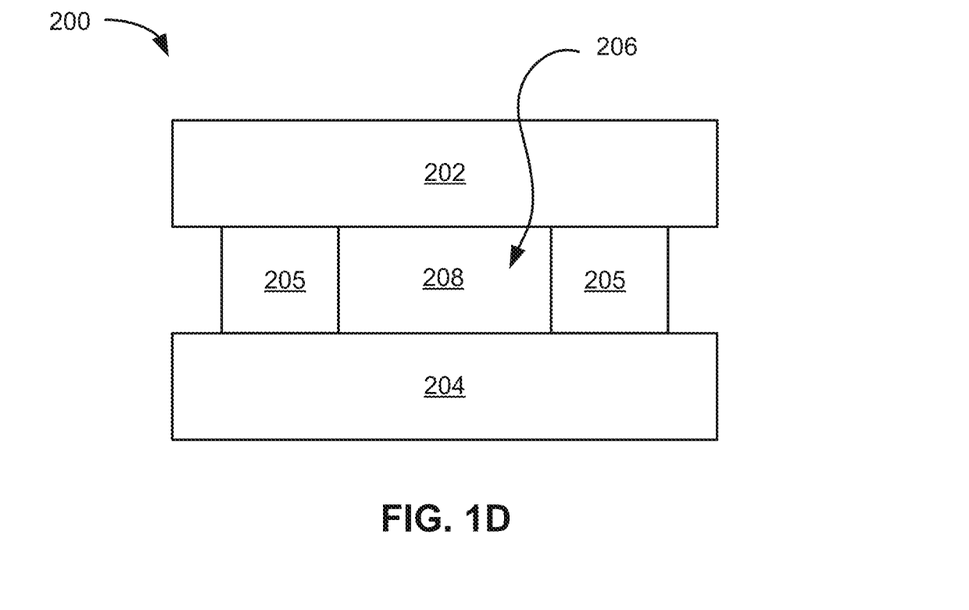
FIG. 1D is a schematic drawing of a cross-section view of a device, according to one embodiment.

FIG. 1D depicts a device 200, in accordance with one embodiment. As an option, the present device 200 may be implemented in conjunction with features from any other embodiment listed herein, such as those described with reference to the other FIGS. Of course, however, such device 200 and others presented herein may be used in various applications and/or in permutations which may or may not be specifically described in the illustrative embodiments listed herein. Further, device 200 presented herein may be used in any desired environment.

In one embodiment as shown in FIG. 1D, a device 200 may be a heterojunction device that includes a first electrode 202 where the first electrode includes a metal, a second electrode 204 spaced from the first electrode 202, where the second electrode 204 includes a first semiconductor material, a wall 205 defining a well 206 extending between the first electrode 202 and the second electrode 204, and a mixture 208 in the well 206. The mixture 208 in the well 206 may include a liquid semiconductor material and at least one halogen where the liquid semiconductor material may be a second semiconductor material. Furthermore, the first semiconductor material may be different than the second semiconductor material, e.g., in terms of composition, concentrations, etc. In some approaches, the first semiconductor material may include one or more chalcogens and one or more halogens. A liquid semiconductor material as defined herein as a material that acts as a semiconductor in the liquid state. Looking back to FIGS. 1A-1D, the first and second electrodes 102, 104 may form an Ohmic contact with the mixture 108 of the liquid semiconductor. In various approaches, the mixture 108 of the liquid semiconductor may be in contact with the first electrode 102 comprised of metal (e.g. Al, In, Ni, Au, Pt, etc), a conducting ceramic (e.g. ITO, FTO, AZO, TaC, Ti$_{B2}$, TaN, etc) or a semiconductor (e.g. SiC, GaN, Si, GaAs, etc), to form an Ohmic contact. In other approaches, the liquid semiconductor material and the other of the electrodes, for example, the second electrode 104, may form an Ohmic contact.

In one embodiment, the device may function as a Schottky diode.

Moreover, various embodiments described herein include a unique structure utilizing one or more material in contact with the liquid semiconductor to create a Schottky diode or a heterojunction device such as a p-i-n diode. An example of a type of heterojunction diode may be defined as being a semiconductor diode formed by the junction of a liquid semiconductor with another semiconductor.

Figure 2A:
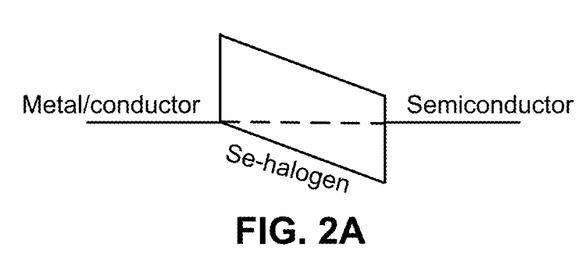
FIGS. 2A-2C are drawings of band diagrams of heterojunction diodes, according to various embodiments.
Figure 2B:
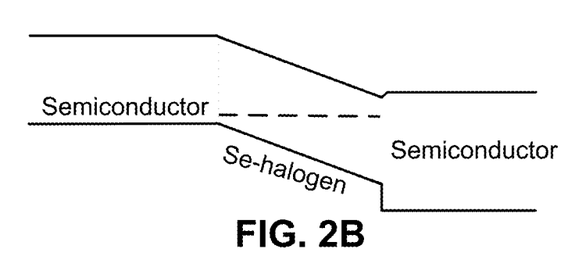
Figure 2C:
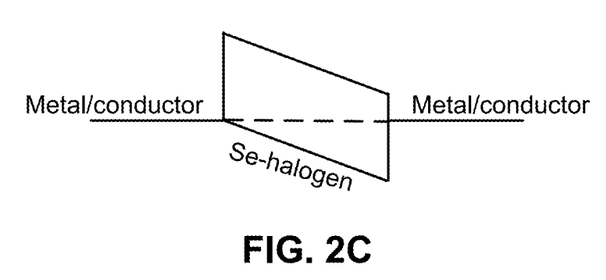

According to various embodiments, FIGS. 2A-2C illustrate the band diagrams of heterojunctions formed with a liquid semiconductor where selenium:halogen is shown as an example of a liquid semiconductor but is not intended to limit the invention in any way. As shown in the band diagram in FIG. 2A, liquid semiconductor (Se-halogen) may be positioned between a semiconductor (on the right) and a metal (on the left). The metal may be a conventional metal (e.g. Al, Ni, Au, etc) or may be a ceramic (e.g. ITO, FTO, AZO, TaC, TiB$_2$, TaN, etc. As depicted in FIG. 2A, the bands line up in such a way that slopes in the selenium:halogen indicates that there may be a built-in electric field that may sweep the carriers out and create the voltage.

The band diagram of FIG. 2B depicts a possible heterojunction diode of which the device includes an interface between the liquid semiconductor and a solid semiconductor. A p-i-n diode has a wide undoped intrinsic semiconductor region between a p-type semiconductor and an n-type semiconductor region. The p-type and n-type regions may be heavily doped as they are used for ohmic contacts.

FIG. 2C is an example of a Schottky type diode in which two dissimilar metals are positioned as electrodes on either side of the selenium:halogen. Examples of pairs of metals in this type of device may be Al and Au, Al and Ni, etc. The metal pairs may be selected according to how the bands line up.

According to various embodiments, conductive ceramic may be a contact with a metal as the other contact. In other embodiments, conductive ceramic may be a contact with a semiconductor as the other contact. In yet other embodiments, conductive ceramic may be a contact with a dissimilar conductive ceramic as the other contact. Any arrangement of metal, conducting ceramic, or semiconductor may be possible depending on the device characteristics required.

Various embodiments that describe these types of diodes may provide enhanced stability and may achieve higher output power than if only metals were used as contacts.

According to various embodiments, the device may have a surface of at least one of the electrodes facing the well mat have a non-planar, three dimensional structure for improving charge carrier collection efficiency. In one approach, the device has a surface of at least one of the electrodes facing the well is along the bottom of the well. In another approach, the device has a surface of at least one of the electrodes facing the well is along a side of the well. In yet another approach, the device may have a surface of at least one of the electrodes facing the well is along the top of the well.

Figure 3A:
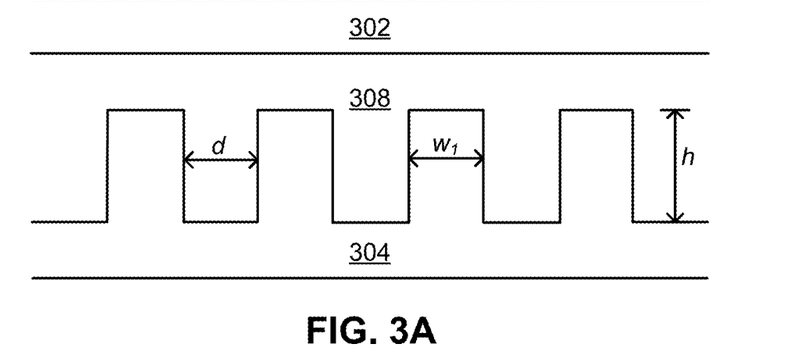
FIGS. 3A-3C are drawings of 3D structures of the electrodes of the device, according to various embodiments.
Figure 3B:
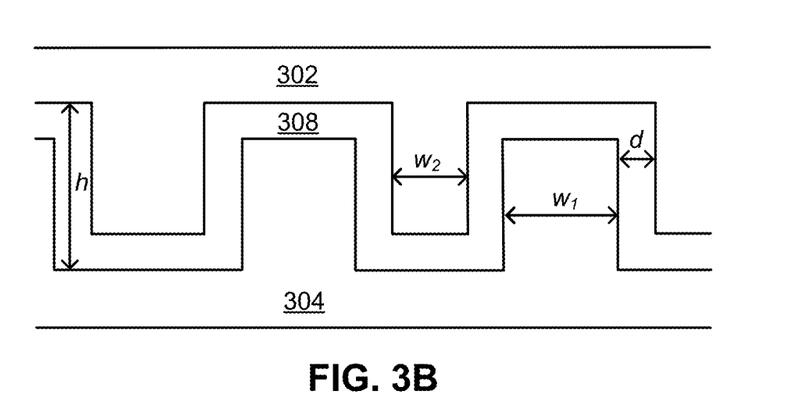
Figure 3C:
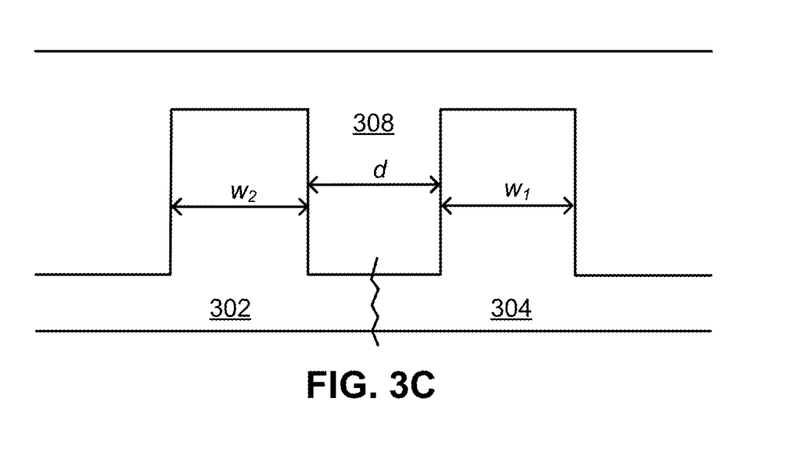

Various embodiments described herein utilize a three dimensional structure for the electrodes. In some embodiments as illustrated in FIGS. 3A-3C, the solid semiconductors may have a three dimensionally structured or interdigitated shape to functionalize an increased volume with low drift and diffusion distances between electrodes and to create higher power densities (see, e.g., U.S. patent application Ser. No. 14/214,244 which is herein incorporated by reference), for example, while also maintaining short drift and diffusion lengths for generated carriers.

For instance, various embodiments may utilize an array of interdigitated electrodes with liquid selenium located in between. As shown in FIG. 3A, the second electrode 304 (but could be contact, substrate, first electrode, etc) may be patterned into a 3D structure and the first electrode 302 (substrate, contact, second electrode, etc) may be flat with the liquid semiconductor 308 (e.g. selenium:halogen) impregnated therebetween.

Furthermore, a 3D structure of the electrodes may enable an increased volume device to create higher power densities, for instance, as shown in FIG. 3B a 3D structure in which both the first and second electrode 302,304 (substrate, contact, electrode, etc) may be patterned, and with the same or different widths (width 2 $w_2$ and width 1 $w_1$, respectively) to optimize efficiency, and offset so there may be a constant difference between, with the liquid semiconductor 308 therebetween.

FIG. 3C shows a 3D structure in which one substrate has a pattern of ridges such that ridge 1 may be the first electrode 302 (contact, substrate, etc.) and ridge 2 may be the second electrode 304 (contact, substrate, etc.) with width 2 $w_2$ and width 1 $w_1$, respectively, to optimize efficiency. The 3D structures shown in FIGS. 3A and 3B represent vertical devices, and the 3D structure shown in FIG. 3C represents a lateral device. Alternatively, mesh electrodes may be used.

In various embodiments shown in FIGS. 3A-3C, the dimensions of the 3D structure may be such that the height h may be between about 1 μm and 500 μm while the widths $w_1$, $w_2$ may be in a range of about 1 μm to about 50 μm and spacing d may be in a range of about 1 μm to about 50 μm. In some approaches, a larger volume device may be created while preserving a short drift/diffusion length thereby accommodating the limited mobility and carrier lifetime of both electrons and holes and the micron scale of expected drift/diffusion lengths. Moreover, collection of charge carriers may be most efficient when the electrode spacing and the drift/diffusion length are comparable. In exemplary embodiments of radioisotope batteries and particle detection, it is preferable to have relatively thick/volumetrically large devices in order to create high power densities and efficiency due to the relatively larger track length of the particles of interest (tens to hundreds of microns).

In some embodiments, the diode architecture may include a radioactive material for providing thermal energy to melt the liquid semiconductor. In some approaches, the device may be combined with a radioactive material to generate electrical power. The radioactive material may provide enough thermal energy to melt the liquid semiconductor and keep it in the liquid state. In some approaches, the diode architecture may support beta radioisotopes or alpha radioisotopes, or possibly a mixture of radioisotope material in order to engineer an energy and longevity profile desired. Beta emitters may include TiTritide and related tritium compounds, $^{63}$Ni, $^{147}$Pm, and $^{90}$Sr(Y). Alpha emitters may include $^{148}$Gd, $^{232}$U and $^{233}$U, $^{238}$Pu, $^{241}$Am, $^{243}$Am, $^{244}$Cm, $^{210}$Po, and $^{252}$Cf. These examples are not exhaustive and do not limit the range for these embodiments.

Radioisotope material ranges from beta emitters of exceptionally low energy, generally below 1 meV (milli electron volts) to alpha emitters of high energy, generally between 3 and 6.5 MeV (mega electron volts). One skilled in the art may configure any combination or addition to the list. The mixtures of radioisotope material may be tailored to provide a desired energy and/or temporal profile.

Figure 4A:
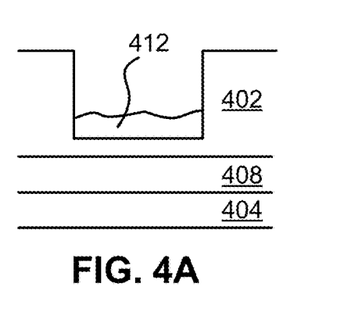
FIGS. 4A-4G are drawings of radioisotope configurations of the device, according to various embodiments.
Figure 4B:
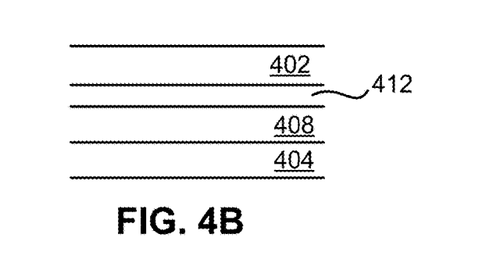
Figure 4C:
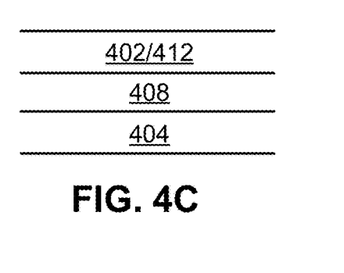

In various approaches, the radioactive material may be incorporated in a variety of ways including but not limited to the examples as illustrated in FIGS. 4A-4G. In one approach shown in FIG. 4A, the radioactive material 412 may be separated from the liquid semiconductor 408, for example, the radioactive material 412 may be layered above the first electrode 402, with the second electrode 404 below the liquid semiconductor 408. In this approach, the radioactive material 412 would penetrate the first electrode 402 and the housing of the liquid semiconductor. In one approach as shown in FIG. 4B, the radioactive material 412 may be a layer positioned above the liquid semiconductor 408 and below the first electrode 402. In an approach shown in FIG. 4C, the radioactive material 412 acts as a first electrode 402 positioned above the liquid semiconductor material.

Figure 4D:
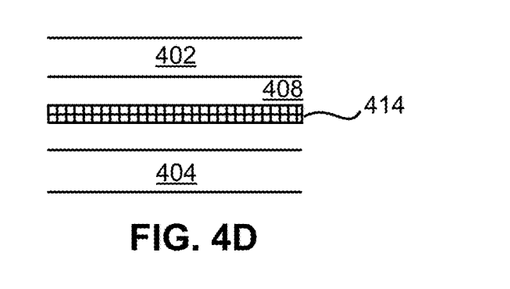
Figure 4E:
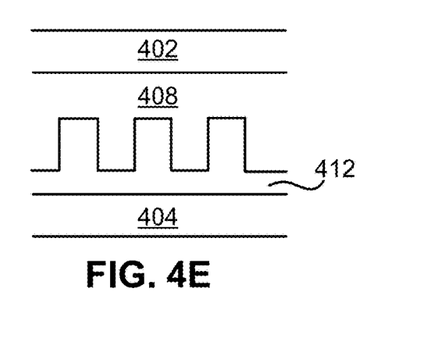

In another approach shown in FIG. 4D, the radioactive material may be a structural material (e.g. a grid 414) floating in the liquid semiconductor 408 with the second electrode 404 positioned below the liquid semiconductor 408. In another approach, the grid or mesh may be immersed in the liquid semiconductor. In other approaches, the radioactive material 412 may act as a structural material (e.g. 3D pillar, ridges, structures, etc.) providing 3D shape on one of the electrodes and evenly distributing the radioactive material 412 with the liquid semiconductor 408. For example, as shown in FIG. 4E, the radioactive material 412 provides a 3D structure of pillars above the second electrode 404 with the liquid semiconductor 408 above radioactive material 412.

Figure 4F:
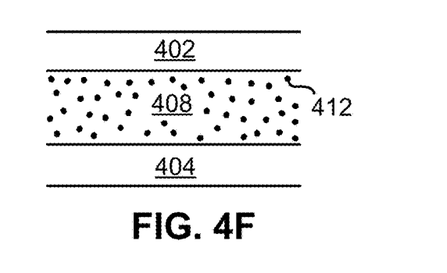
Figure 4G:
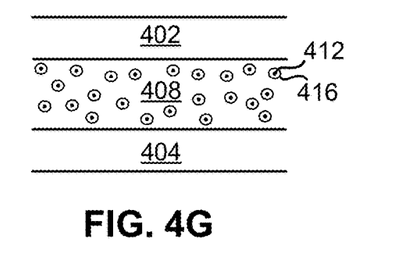

In some approaches, the radioactive material may be reacted, dissolved, or in suspension in the liquid semiconductor as shown in FIG. 4F. Preferably, the particles of radioactive material 412 are distributed throughout the volume of liquid semiconductor 408. In another approach as shown in FIG. 4G, the radioactive material 412 may be a core shell type of structure where the core is the radioactive material 412 and may be encased in a non-reactive shell 416 and in suspension with the liquid semiconductor 408 such that the radioactive material 412 does not react with the liquid semiconductor 408 while being distributed throughout the liquid semiconductor 408. FIGS. 4A-4G are examples of how the radioisotope may be poured into, as one of the electrodes, dissolved or in suspension within the liquid itself and are in no way meant to limit the possible ways to incorporate the radioactive source in the device.

According to various embodiments, the device may include a sidewall of polymeric, polymer, dielectric, etc. material that is impermeable to gas.

Figure 5:
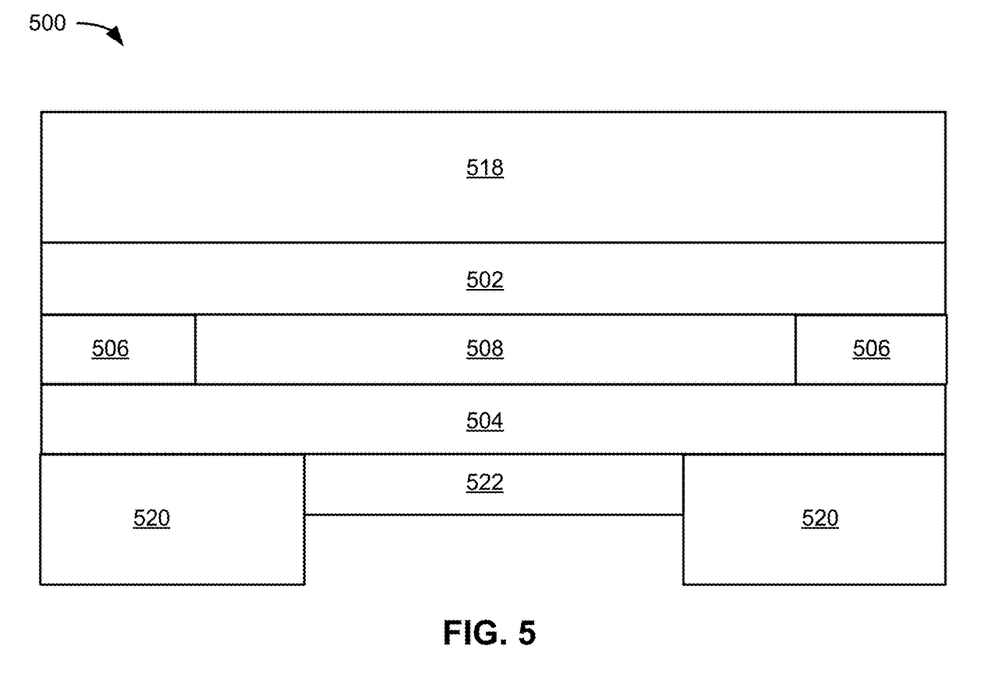
FIG. 5 is a schematic drawing of a cross-section view of a device, according to one embodiment.

FIG. 5 depicts a device 500 that may function as a diode, in accordance with one embodiment. As an option, the present device 500 may be implemented in conjunction with features from any other embodiment listed herein, such as those described with reference to the other FIGS. Of course, however, such device 500 and others presented herein may be used in various applications and/or in permutations which may or may not be specifically described in the illustrative embodiments listed herein. Further, device 500 presented herein may be used in any desired environment.

FIG. 5 depicts a drawing of a diode with an external radioactive material according to one embodiment. The radioactive material 522 may be positioned below the second electrode 504 and the mixture 508 of a liquid semiconductor with halogen. As an example, the liquid semiconductor:halogen may be selenium:iodine layer in a thickness of about 5 to 10 μm. The second electrode may be a layer of GaN or ITO in a thickness of about 1 to 3 μm. A well 506 encapsulates the mixture 508 of the liquid semiconductor (e.g. selenium:iodine layer) and may include photoresist, SU-8, dielectric such as $SiO_2$, teflon and spin on fluorocarbon. The well 506 is positioned around the liquid semiconductor layer and between the first electrode 502 and the second electrode 504. Layers of silicon or other structural material 518, 520 may be positioned above and below the diode structure.

In some embodiments, as bias is applied to the top electrode or the bottom electrode the device may perform as a semiconductor device, for example, a p-i-n diode.

In further embodiments, the device may function as a photovoltaic or a radioisotope battery. For example, the charge carriers may originate from radiation (for example, in a solar cell, the charge carriers originate from photons). These radiation particles may deposit energy in the liquid semiconductor which in turn generates charge carriers. Since the device may have with two dissimilar materials for the electrodes, representing a diode, e.g., a Schottky diode or a p.i.n. diode or a p-n. diode, those charge carriers may be swept to the electrode thereby resulting in power generation which is determined by the number of carriers generated. The current and the band line-ups may determine the operating voltage.

Experiments

Halogen and Liquid Semiconductor

Figure 6A:
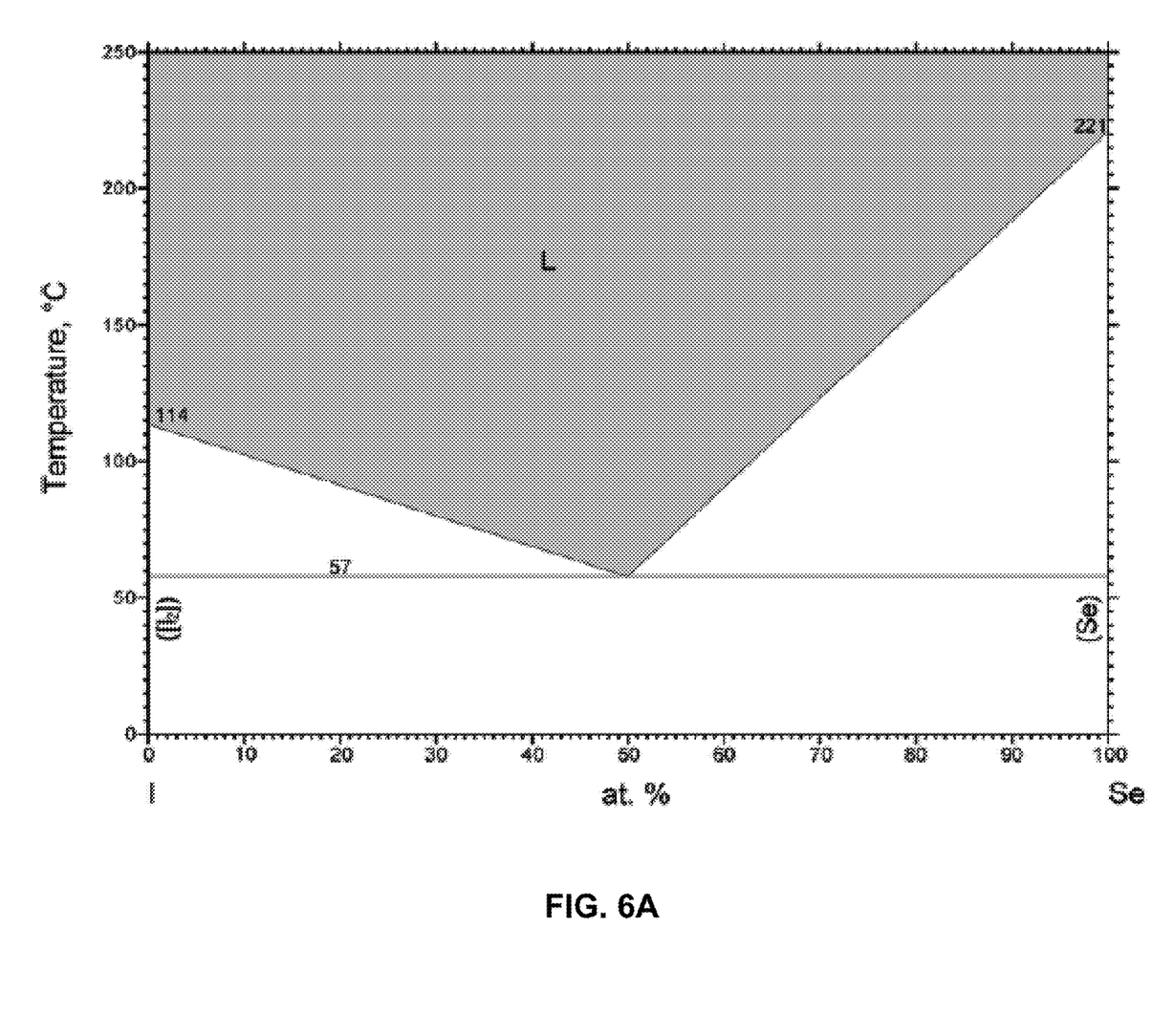
FIG. 6A is a phase diagram of selenium:iodine.
Figure 6B:
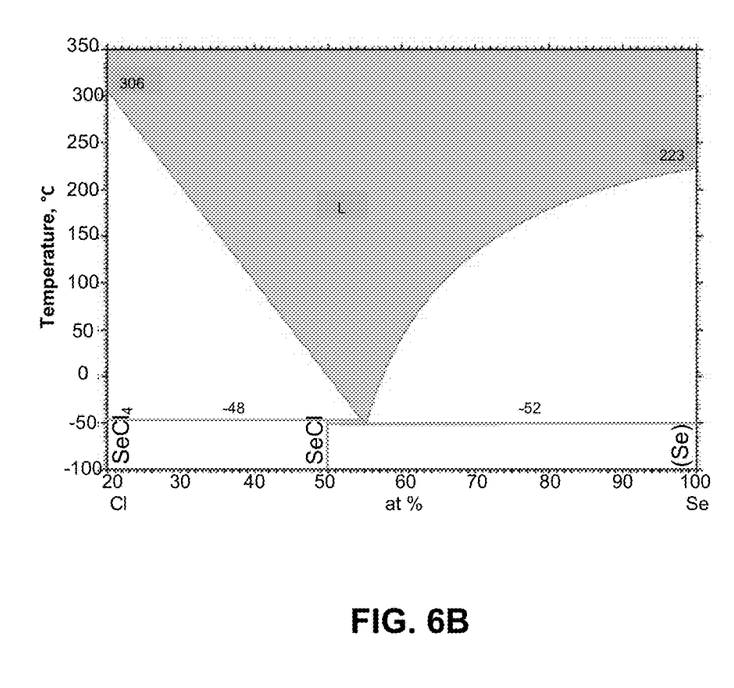
FIG. 6B is a phase diagram of selenium:chlorine.
Figure 6C:
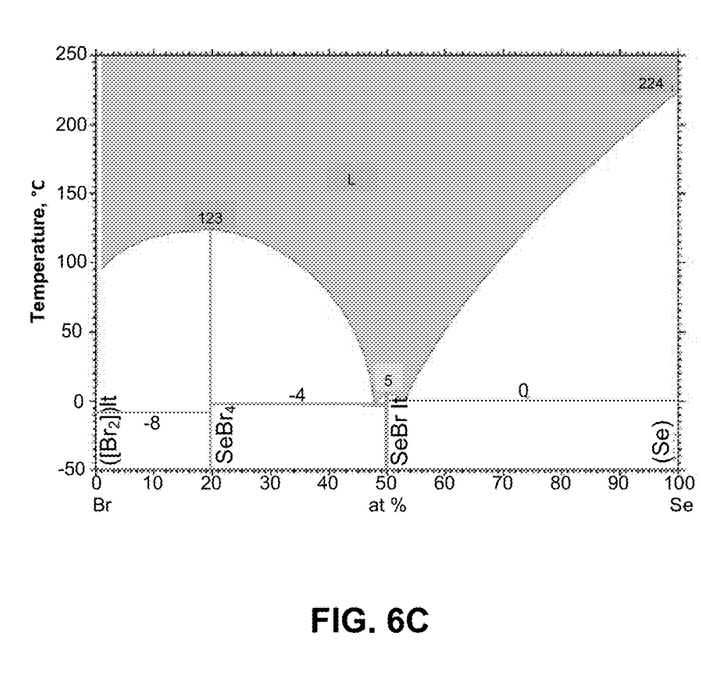
FIG. 6C is a phase diagram of selenium:bromine

The device described herein may use halogens such as iodine at high levels (up to 80%) to significantly depress the melting point of the liquid semiconductor. Using these halogens, the melting point can be adjusted to be below room temperature. FIGS. 6A-6C represent phase diagrams of selenium in increasing ratio with halogens. FIG. 6A is a binary phase diagram for selenium and iodine. The shaded region depicts liquid phase of the selenium-halogen mixture. At the far right of the diagram, selenium is at 100%, and the melting point is at 221° C. As the percentage (%) of iodine is increased with decreasing % of selenium in a continuous mixture of atomic I and Se in equilibrium with each other, the melting point is suppressed, to the lowest point of the eutectic composition at 50:50 selenium:iodine with at a temperature of 57° C.

FIGS. 6B and 6C are similar phase diagrams of chlorine (Cl) with selenium (FIG. 6C) and bromine (Br) with selenium (FIG. 6B). These halogens suppress the melting point of selenium to below room temperature. FIG. 6B shows the selenium:chlorine at 56:44 drops to −52° C. FIG. 6C shows the selenium:bromine at 52:48 drops to 0° C.

The inventors have observed liquid semiconductor operation in the form of a p-i-n junction diode at temperatures as low as 59° C. utilizing a 50:50 mixture of Se:I.

TABLE 1

|  | Stabilized a-Se (0.3% As, 5 ppm Cl) | | a-Se | | |
| --- | --- | --- | --- | --- | --- |
|  | Electron | Hole | Electron | Hole | L-Se |
| Lifetime (us) | 342 | 77.6 | 155 | 10.2 |  |
| Mobility | 2.89E−03 | 0.1183 | 4.107E−03 | 0.129 | 2 (hole) |
| uT | 9.79E−07 | 9.18E−06 | 6.37E−07 | 1.32E−06 |  |
| Eg | 2.2 | | 1.74 | | 1.8 |
| Work function | 5.88 | | 5.88 | | 5.5 |
| Electron affinity | | | | | 4.2 |

Table 1 compares parameters for different forms of selenium. The first columns are stabilized amorphous selenium, the middle columns are amorphous selenium. Both forms of amorphous selenium are solid. Liquid selenium is shown in the last column. Electron and hole values describe the electron mobility in the amorphous selenium. $E_g$ is the energy of the band gap. These parameters may be useful for design of the device described herein.

Preparation of a Device with a Se:I Mixture

The method for preparing Se:I mixtures was performed in an Ar glove box. Calculated amounts of Se and $I_2$ were weighed on a balance and the $I_2$ put into a sealed scintillation vial. All tests were performed using approximately 50:50 atomic ratios of Se:I. A vial of $I_2$ was heated on a hot plate set at 160° C., a temperature significantly above the melting point of pure $I_2$ (113.7° C.). Relatively quickly, the $I_2$ began to melt and sublime. The Se was dissolved into the mixture. After total dissolution of the Se, the hot plate temperature was decreased to 60° C., just over the melting point of the eutectic composition.

A micropipette was used to transfer 0.5-1 µL amounts of the Se:I liquid mixture onto the desired substrate, which was patterned with a polymer well (SU-8) to contain the mixture. A second substrate was then pressed on top of the droplet in the polymer well to spread the droplet so that it filled the well and to seal the device by bonding with the SU-8. An additional sealant of UV curable epoxy was then painted around the outside of the device and cured by hand-held UV light. It was observed that, properly prepared, the SU-8 and epoxy were fairly impervious to the Se:I mixture.

Table 2 compares simulated parameters of different devices, Schottky diode Al—Se—Ni device and an ITO—Se—GaN heterojunction device as described in various embodiments herein. The ITO—Se—GaN device demonstrated a 50% higher voltage (0.68 V) than the Al—Se—Ni (0.455 V), where $V_{oc}$ represents an open circuit voltage of the voltage being generated. Moreover, the power output in the ITO—Se—GaN (208 nW/cm$^2$) was almost twice the power output of the Al—Se—Ni (122 nW/cm$^2$). The Fill Factor (FF) and Jsc value, which show the efficiency of the system and the short circuit current (basically, the number of charge carriers that are generated for a given amount of radiation), respectively, was similar for both devices, as expected. Additional drawbacks of the conventional Al—Se—Ni device include the reactivity of Al and Ni with selenium that may limit the functionality of the device as a power output source.

TABLE 2

| Device | Jsc (A/cm$^2$) | Voc (V) | FF | Power (nW/cm$^2$) |
| --- | --- | --- | --- | --- |
| Al—Se—Ni | 4.57E−07 | 0.455 | 58.70% | 122 |
| ITO-Se—GaN | 4.61E−07 | 0.68 | 66.40% | 208 |

A Photovoltaic Device

Figure 7A:
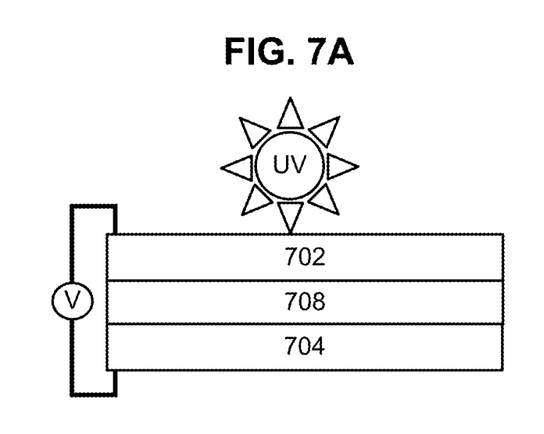
FIG. 7A is a schematic drawing of a heterojunction diode device according to one embodiment.

An embodiment of the device described herein was assessed for photovoltaic functionality. A GaN//Se:I//ITO structure of which a glass slide coated with an upper electrode ITO facing the mixture of liquid semiconductor and iodine (Se:I) and a sapphire wafer coated with a lower electrode GaN facing the mixture of the liquid Se:I. Further, the mixture of liquid Se:I contained within a Su-8 well was sandwiched between the two glass slide electrodes. FIG. 7A shows a diagram of the device with the upper electrode 702 made of ITO, the lower electrode 704 of n-GaN (1e19 cm$^{-3}$), and 50:50 selenium:iodine mixture 708 (approximately 1 µL, 25-30 µm) contained within a well (not shown) in between the electrodes. UV light is used instead of a radioisotope.

Figure 7B:
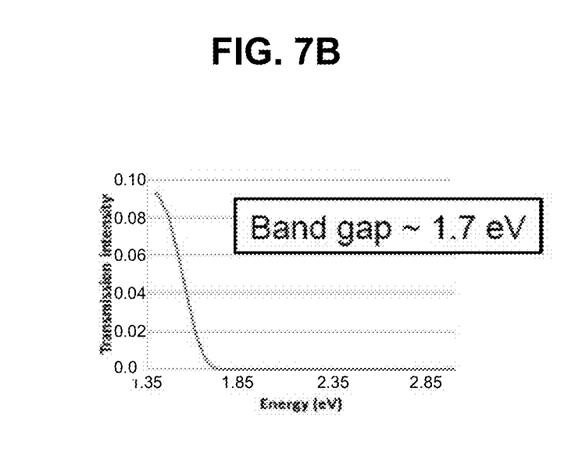
FIG. 7B is a plot of transmission intensity of the liquid Se:I in a heterojunction diode, according to one embodiment.

FIGS. 7B-7E show various photovoltaic functions of the device illustrated in FIG. 7A. FIG. 7B is a plot of the transmission of intensity of the device measured by inserting the glass electrodes sandwiching the Se:I into a J. A.

Woollam alpha Spectroscopic Ellipsometer (Lincoln, Nebr.). The transmission was measured over the range of 1.36 to 3.2 eV. FIG. 7B shows the transmitted intensity of the light through approximately 20 µm 50:50 Se:I sandwiched in 2 mm of glass at room temperature. A band edge was observed giving a band gap of approximately 1.7 eV.

After fabrication, the device illustrated in the schematic drawing in FIG. 7A was measured as a function of temperature both in the dark and exposed to UV light from 24° C. up to 80° C., in approximately 5° C. steps. At 59° C., it was observed that the Se—I had become a liquid, as predicted. At all temperatures, the structure behaved as a diode in the dark and as a photovoltaic cell when exposed to light.

Figure 7C:
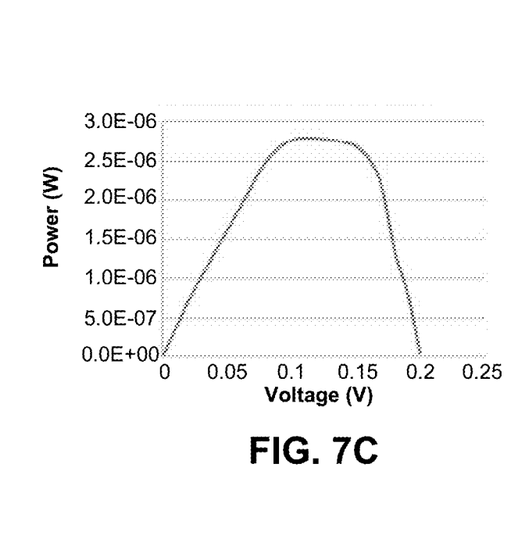
FIG. 7C is a plot of power output compared to voltage of a heterojunction diode, according to one embodiment.

FIG. 7C is plot of the power output compared to voltage of the device in FIG. 7A at 80° C. Table 3 below lists a summary of the parameters of the device of FIG. 7A at three temperatures, 25° C. (solid), 59° C. (liquid), and 80° C. (liquid). As shown with the liquid semiconductors, the devices at 59° C. and at 80° C. generated on the order of 5-10 mW/cm$^3$ using a UV light source.

TABLE 3

| Parameter | 25° C. (solid) | 59° C. (liquid) | 80° C. (liquid) |
|---|---|---|---|
| Open circuit voltage ($V_{oc}$) | 0.4 | 0.22 | 0.2 |
| Short circuit current ($I_{sc}$) | 1.30E−05 | 2.20E−05 | 3.80E−05 |
| Fill Factor | 31.50% | 39.50% | 36.80% |
| Maximum Power | 1.6 µW | 1.9 µW | 2.8 µW |
| Maximum power density | 1.6-4.4 mW/cm$^3$ | 1.9-5 mW/cm$^3$ | 2.8-7.8 mW/cm$^3$ |
| Ideality factor | 3 | 1.83 | 1.61 |

Figure 7D:
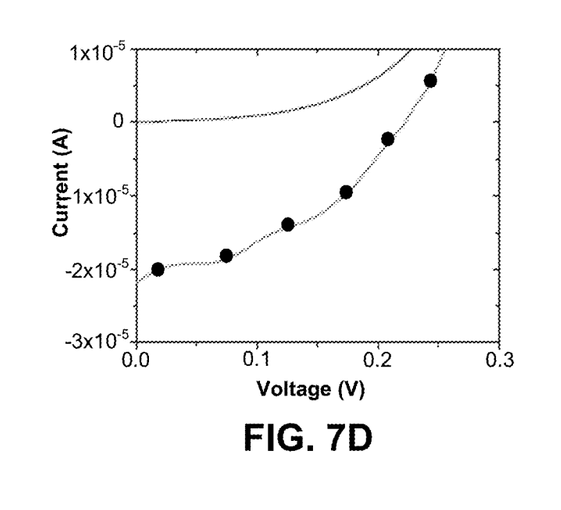
FIG. 7D is a plot of dark and photocurrent measurements of liquid Se—I heterojunction diode showing power generation, according to one embodiment.

FIG. 7D is a plot of current-voltage (IC) curves of the device with liquid selenium operated at 59° C. in the dark (solid black line) and illuminated (• line). Parameters for the device at three temperatures (25° C., 59° C., and 80° C.) upon illumination are listed in Table 3. The device functions as a diode in the dark with black current (solid black line) very low at 0 V and increasing with applied bias. Upon illumination, the photo current (• line) with a short circuit current ($I_{sc}$) at 0 V increased by 10,000× and an open circuit voltage ($V_{oc}$) of 0.22 V was observed (as listed in Table 3).

Table 4 compares predicted values of parameters of the heterojunction diode device compared to measured values. Note that at room temperature (25° C.) the $V_{oc}$ was observed to be higher (0.42 V) for the diode compared to the diode with liquid selenium at 59° C. The band gap was extracted from the reverse bias leakage current vs 1/T, giving a value of 1.74 eV, in agreement with both the standard value for liquid Se (1.74 eV) and our transmission measurement of the band gap.

TABLE 4

| Parameter | ° C. | Predicted Value | Measured Value |
|---|---|---|---|
| Band gap | | 1.74 eV | 1.74 eV |
| Carrier concentration | 25° C. | 1.00E+12 | 3.60E+12 |
| | 59° C. | 3.00E+13 | 3.60E+13 |
| Open circuit voltage, ($V_{oc}$) | | 0.68 V | 0.42 V (25° C.), 0.23 (59° C.) |

Capacitance-voltage measurements were performed at room temperature (25° C.) in order to extract carrier concentration density such that a plot of $1/C^2$ vs V gave a value of 3.60E+12 cm$^{-3}$, which is comparable to that reported in the literature (1.00E+12 cm$^{-3}$) (Table 4). Extrapolation of the carrier density at 59° C. using an Arrhenius plot of dark current vs 1/T yields a carrier density in the liquid state of 3.60E+13 cm$^{-3}$, very close to the reported 3.00E+13 cm$^{-3}$ reported for pure liquid Se (Table 4). These results suggested that the Se in the mixture is responsible for these properties.

Figure 7E:
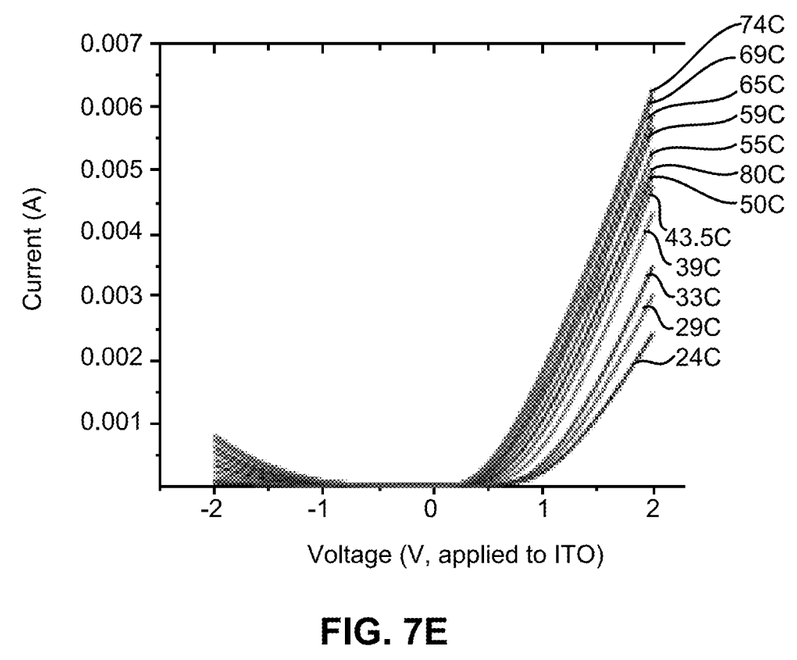
FIG. 7E is a plot of dark current versus voltage for a heterojunction diode at increasing temperatures, according to various embodiments.

FIG. 7E is a plot of the current versus voltage, −2 to 2 V for the device at various temperatures ranging from room temperature, 24° C., to 80° C. in the absence of illumination (dark current). The current versus voltage plot of the device at a specific temperature is indicated on the graph with the temperature labeling the corresponding curve.

In Use

In use, various embodiments described herein may be useful for, high flux particle detectors, high energy particle detectors, and electronics in a harsh environment, radiation hard electronics, high temperature electronics, radioisotope battery, and sensors.

A liquid semiconductor, as described in embodiments herein, capable of operating at room temperature with reasonable electronic properties might find use in a number of applications, including radioisotope batteries, thermoelectrics, sensors for harsh environments (high temperature, high radioactive fields), direct ink writing of semiconductors, spin on semiconductors for low cost large area devices, and large volume devices.

Various embodiments described herein include a device that is not limited to radioisotope batteries and is unique in several important aspects. While its initial conception was to produce an alphavoltaic with minimal or no degradation, the device described herein may also be used as a sensor for harsh environments (e.g. a particle detector in a high radiation and/or temperature location), a thermoelectric, radiation hard electronics, and more.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure. Moreover, unless otherwise specified, conventional techniques may be employed during fabrication and/or use of any of the embodiments described herein.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A device, comprising:
   a first electrode;
   a second electrode spaced from the first electrode;
   a well extending between the first electrode and the second electrode;
   one or more chalcogens in the well, the one or more chalcogens being selected from the group consisting of sulfur, selenium, tellurium, and polonium; and
   at least one halogen mixed with the one or more chalcogens in the well,
   wherein the at least one halogen is present in an effective amount to suppress the melting point of the one or more chalcogens by at least 5 degrees Celsius.

2. The device as recited in claim 1, wherein the one or more chalcogens includes selenium.

3. The device as recited in claim 1, wherein the second electrode is patterned into a three dimensional structure and the first electrode is flat.

4. The device as recited in claim 1, wherein a material of the first electrode is different from a material of the second electrode, wherein the device functions as a diode.

5. The device as recited in claim 1, comprising an impermeable encapsulant encapsulating at least a portion of the one or more chalcogens mixed with the at least one halogen in the well.

6. The device as recited in claim 1, comprising a radioactive material, wherein the radioactive material is configured to function as a structural material in the device.

7. The device as recited claim 1, wherein the at least one halogen is present in an amount of greater than 1.0 at. % in a mixture of the one or more chalcogens mixed with the at least one halogen.

8. The device as recited in claim 1, wherein the at least one halogen is selected from the group consisting of: chlorine, bromine, fluorine, and iodine.

9. The device as recited in claim 8, wherein the halogen is present in an effective amount to suppress the melting point of the one or more chalcogens by at least 10 degrees Celsius.

10. The device as recited in claim 1, wherein the one or more chalcogens mixed with the at least one halogen in the well and one of the electrodes form a heterojunction.

11. The device as recited in claim 10, wherein the one or more chalcogens mixed with the at least one halogen in the well and the other of the electrodes form a second heterojunction.

12. The device as recited in claim 1, wherein a surface of at least one of the electrodes facing the well has a non-planar, three dimensional structure for improving charge carrier collection efficiency.

13. The device as recited in claim 12, wherein a height of the three dimensional structure is between about 1 µm and about 500 µm, wherein a width is between about 1 µm and about 50 µm, and a spacing is between about 1 µm and about 50 µm.

14. A device, comprising:
   a first electrode;
   a second electrode spaced from the first electrode;
   a well extending between the first electrode and the second electrode; and
   a mixture in the well, the mixture comprising at least one halogen and at least one semiconductor material selected from the group consisting of sulfur, selenium, tellurium, and polonium,
   wherein the at least one halogen is present in an amount of greater than 1.0 at. % in the mixture to suppress the melting point of the semiconductor material.

15. The device as recited in claim 14, wherein the semiconductor material is selenium.

16. The device as recited in claim 14, comprising a radioactive material for providing thermal energy to melt the semiconductor material, wherein the radioactive material is separated from the mixture in the well.

17. The device as recited in claim 14, wherein the at least one halogen is present in an effective amount to suppress the melting point of the at least one semiconductor material by at least 5 degrees Celsius.

18. The device as recited in claim 14, the at least one halogen in the well is selected from a group consisting of: chlorine, bromine, fluorine, and iodine.

19. The device as recited in claim 18, wherein the semiconductor material includes at least one of a pure chalcogen, wherein the halogen is present in an effective amount to suppress the melting point of the semiconductor material relative to the at least one of the pure chalcogen.

20. A heterojunction device, comprising:
   a first electrode wherein the first electrode comprises a metal;
   a second electrode spaced from the first electrode, wherein the second electrode comprises a first semiconductor material;
   a well extending between the first electrode and the second electrode; and
   a mixture in the well, the mixture comprising a liquid semiconductor material and at least one halogen wherein the liquid semiconductor material is a second semiconductor material, wherein the first semiconductor material is different from the second semiconductor material,
   wherein the at least one halogen is present in an effective amount to suppress the melting point of the liquid semiconductor material by at least 5 degrees Celsius.

* * * * *